(12) United States Patent
Hara et al.

(10) Patent No.: US 6,985,111 B2
(45) Date of Patent: Jan. 10, 2006

(54) PRINTED CIRCUIT BOARD AND WIRELESS COMMUNICATION APPARATUS

(75) Inventors: Tsutomu Hara, Yokohama (JP); Takashi Matsumoto, Yokohama (JP); Hideki Osaka, Oiso (JP); Hitoshi Yokota, Kawasaki (JP); Kenji Kashiwagi, Minamiashigara (JP)

(73) Assignee: Hitachi Ltd., Tokyo (JP)

( * ) Notice: Subject to any disclaimer, the term of this patent is extended or adjusted under 35 U.S.C. 154(b) by 73 days.

(21) Appl. No.: 10/717,192

(22) Filed: Nov. 20, 2003

(65) Prior Publication Data

US 2004/0246187 A1 Dec. 9, 2004

(30) Foreign Application Priority Data

Jun. 5, 2003 (JP) .............................. 2003-161103

(51) Int. Cl.
*H01Q 1/24* (2006.01)

(52) U.S. Cl. .............................. 343/702; 343/700 MS; 343/846; 455/90.3

(58) Field of Classification Search ................ 343/702, 343/846, 700 MS; 455/90.3; 361/757; H01Q 1/24
See application file for complete search history.

(56) References Cited

U.S. PATENT DOCUMENTS

| 6,469,670 B2 * | 10/2002 | Ito .............................. 343/702 |
| 6,784,843 B2 * | 8/2004 | Onaka et al. ........ 343/700 MS |
| 2004/0125018 A1 * | 7/2004 | Ramasamy et al. ......... 343/702 |

FOREIGN PATENT DOCUMENTS

JP 10-268988 10/1998

* cited by examiner

*Primary Examiner*—Trinh V. Dinh
*Assistant Examiner*—Binh Van Ho
(74) *Attorney, Agent, or Firm*—McDermott Will & Emery LLP

(57) ABSTRACT

A printed circuit board with reduced noise effects and without the need to increase the distance between a noise source and a wireless communication board. The circuit board includes multilayer structural conductive layers having a first conductive plane connected to power supply potential and a second conductive plane connected to ground potential. The first and second conductive planes are formed such that an electric field generated by a potential difference between the first conductive plane and the second conductive plane is concentrated on one side of one of the first conductive plane and the second conductive plane. The conductive plane associated with the concentrated electric field and the wireless communication board are on different sides relative to the conductive plane that is not associated with the concentrated electric field.

7 Claims, 13 Drawing Sheets

AA' CROSS SECTION

341 ELECTRIC FIELD DISPLAY RANGE
87mm
340
302
87mm
B       B'
309

ELECTRIC FIELD
309    302 MEASUREMENT SURFACE
B                              B'
1.55mm
301    306
305
308
SIGNAL GENERATOR
310

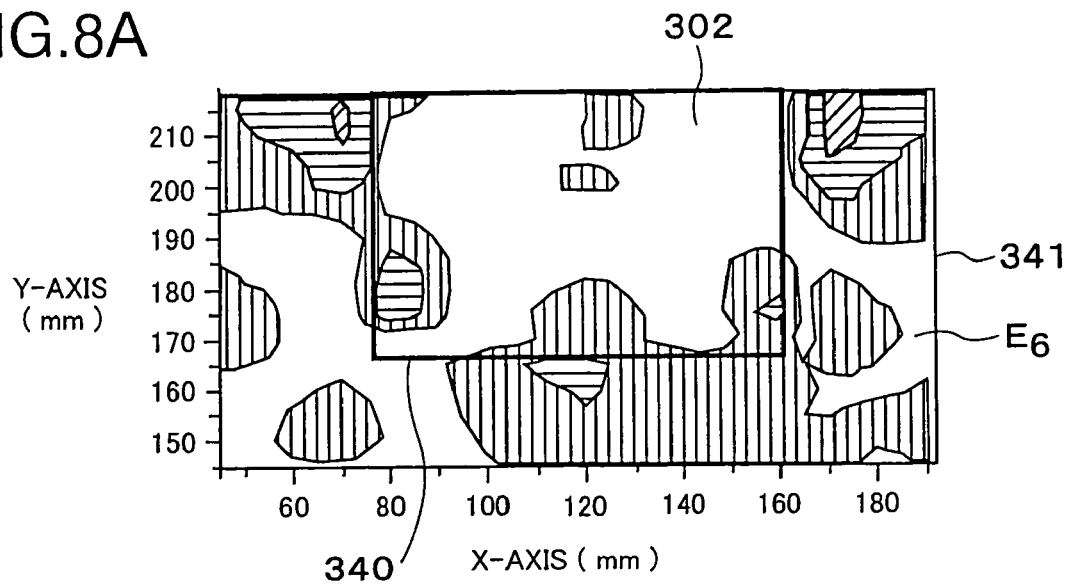
FIG.8A
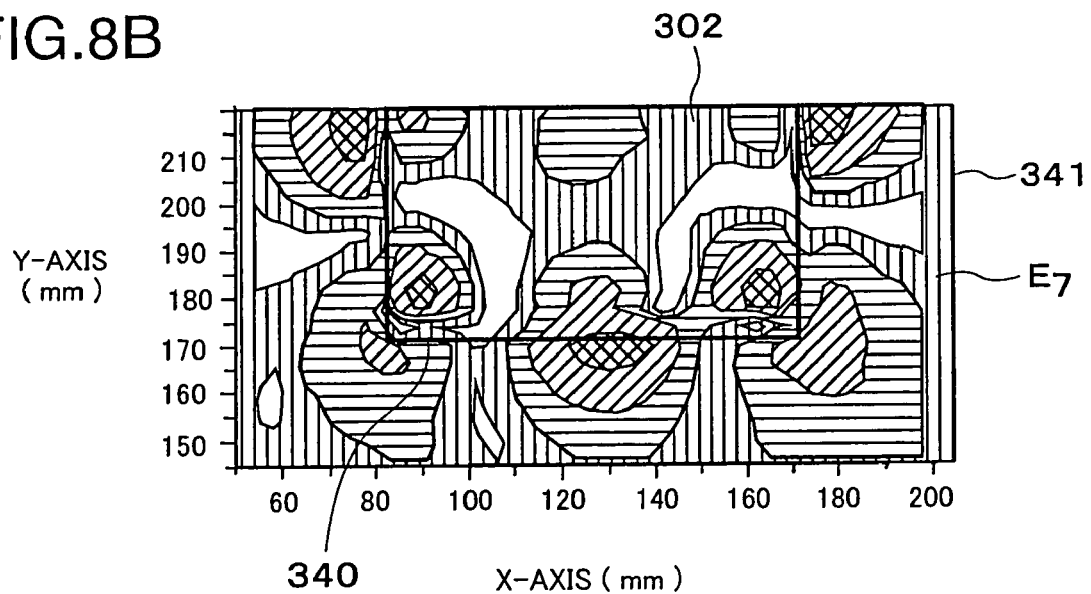
FIG.8B
FIG.8C
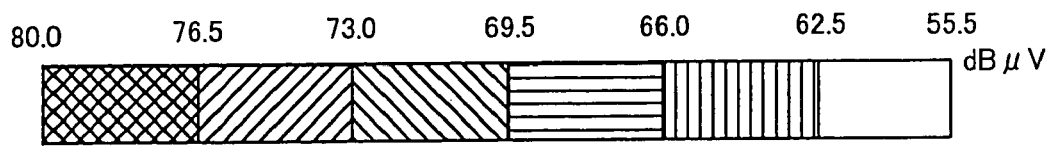

(A)

(B)

AA' CROSS SECTION (EXAMPLE OF PC MOUNTED WITH WIRELESS UNIT OF 2.4 GHZ BAND)

PRINTED CIRCUIT BOARD AND WIRELESS COMMUNICATION APPARATUS

BACKGROUND OF THE INVENTION

The present invention relates to a technique of suppressing electromagnetic waves generated within an apparatus provided with a units of wireless communication, and in particular to a technique of reducing electric field noise generated within a printed circuit board or an information processing apparatus.

In an information processing apparatus, as LSIs used in the apparatus becomes high-speed in their clocks and high-density in their mounting, noise generated within the apparatus increases. In an information processing apparatus or the like having a units of wireless communication, noise generated within the apparatus causes to deteriorate the wireless communication performance such as reduction of the data throughput or of the communication distance between the information processing apparatus and an external source of the communication data (ex. a radio antenna).

FIG. 16 shows an example of results of investigation on the effects of noise within an apparatus on the communication performance. The horizontal axis indicates a communication distance (m) between two communication apparatuses, and the vertical axis indicates a bit error rate (%) of the data. This figure shows a case (a dotted line a) where there exists interference by noise of a CPU or the like, and a case (a solid line b) where there does not exist interference by noise, in a PC mounted with a wireless unit using a 2.4 GHz band. In the case where no interference exists, the communication distance at the error rate 0.1% is about 100 m, while, in the case where interference exists, the communication distance is only about 20 m, i.e., 20% of the former case. Thus, when there is a noise source within an information processing apparatus having a wireless communication function, the noise source deteriorates the wireless communication performance of the apparatus.

As a method of reducing the effects of a noise source on a wireless communication function, there is a proposed mounting method in which a noise source on a circuit board is distant to a wireless communication board, as disclosed in Japanese Application Patent Laid-Open No. 10-268988, "Portable Information Apparatus with Wireless".

However, in this method, a board having a wireless function should be located in a sufficient distance from a noise source on a circuit board, and sometimes this becomes an obstacle to miniaturization of an information processing apparatus. Thus, it is difficult to apply this method, for example, to a cellular phone having a small-sized chassis.

The present invention has been taken the above situation into consideration. One advantage of the present invention is to provide a circuit board that can reduce effects of noise on a wireless communication board mounted on the circuit board, even when a noise source is not distant to the wireless communication board.

Another advantage of the present invention is to apply the above-mentioned circuit board to an information processing apparatus having a wireless communication function, and to provide a small-sized information processing apparatus having an improved wireless communication throughput and an increased communication distance.

SUMMARY OF THE INVENTION

To attain the above advantages, a first mode of the present invention provides a printed circuit board mounted with a wireless communication board, comprising multi-layered conductive layers including a first conductive plane connected to power supply potential and a second conductive plane connected to ground potential. The first and second conductive planes are formed such that: one conductive plane interposes between the other conductive plane and a surface of the printed circuit board on the side where the wireless communication board is mounted, and an electric field generated by a potential difference between the power supply potential and the ground potential is concentrated on the side of the above-mentioned the other conductive plane rather than the side of the above-mentioned one conductive plane.

To attain the above advantages, another mode of the present invention provides the printed circuit board according to the above-mentioned first mode, wherein: said printed circuit board comprises a conductive belt that is formed in a conductive layer in which said the other conductive plane lies, and located adjacent to said the other conductive plane with slits interposing between said conductive belt and said the other conductive plane; and said conductive belt is electrically connected to said one conductive plane.

To attain the above advantages, another mode of the present invention provides the printed circuit board according to the above-mentioned first mode, wherein: said printed circuit board further comprises a U-shaped conductive member that encloses a part of said printed circuit board to cover the surface of said printed circuit board in an area over which said wireless communication board is mounted, and said conductive member is electrically connected to said one conductive layer.

To attain the above advantages, another mode of the present invention provides the printed circuit board according to the above-mentioned first mode, wherein: said the other conductive plane is formed in a smaller size than said one conductive plane, and located within an area of said one conductive plane.

To attain the above advantages, another mode of the present invention provides the printed circuit board according to the above-mentioned first mode, wherein: said printed circuit board comprises: a conductive belt that is formed in a conductive layer in which said the other conductive plane lies, and located adjacent to said the other conductive plane with slits interposing between said conductive belt and said the other conductive plane; and a third conductive plane formed in a conductive layer that is located on an opposite side to said one conductive plane with respect to said the other conductive plane; wherein, said conductive belt and said third conductive plane are electrically connected to said one conductive plane.

To attain the above advantages, another mode of the present invention provides a wireless communication apparatus comprising: one of the above-mentioned printed circuit boards; and a chassis that houses said printed circuit board.

To attain the above advantages, another mode of the present invention provides the above-mentioned wireless communication apparatus further comprising a radio wave absorption member that is located inside said chassis, and absorbs an electric field generated by a potential difference between said power supply potential and said ground potential.

BRIEF DESCRIPTION OF THE DRAWINGS

FIGS. 8A to 8C show measurement results of an electric field around a measuring object board;

DETAILED DESCRIPTION

Embodiments of the present invention will be described.

A first embodiment of the present invention will be described.

Figure 1A:
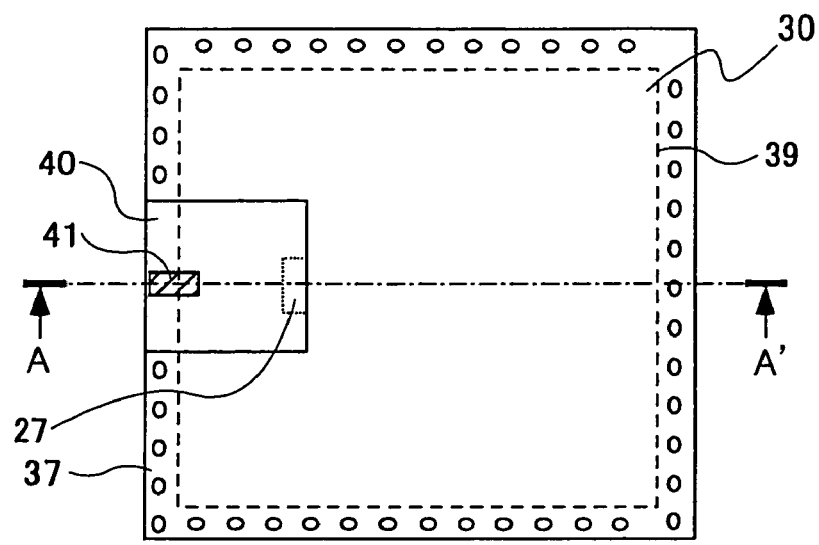
FIGS. 1A to 1C are schematic diagrams showing a printed circuit board according to a first embodiment of the present invention.
Figure 1B:
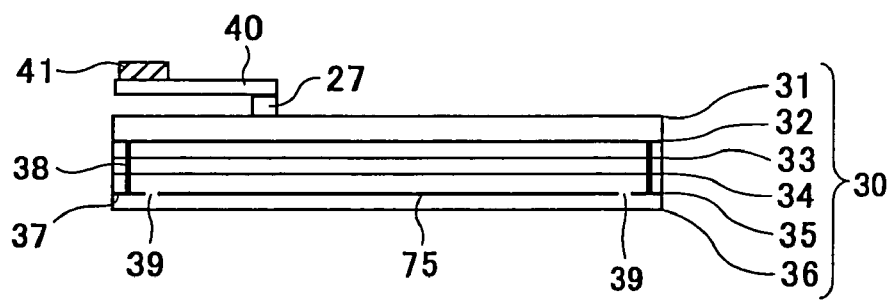
Figure 1C:
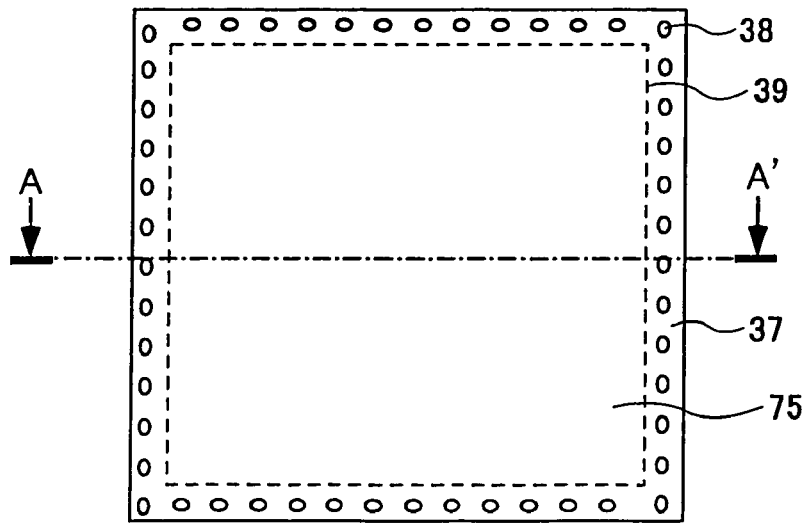

FIGS. 1A to 1C are schematic diagrams showing a printed circuit board to which a first embodiment of the present invention is applied. FIG. 1A is a plan view, FIG. 1B is a cross section taken along the A–A' line of FIG. 1A, and FIG. 1C is a back view.

The printed circuit board of the present embodiment comprises: a main circuit board 30 mounted with digital circuits; an RF circuit board 40 mounted with a wireless communication circuit; an antenna 41; and a connector 27. As shown in FIGS. 1A and 1B, the antenna 41 is located on the RF circuit board 40. The connector 27 supports the antenna 41 and the RF circuit board 40 on the main circuit board 30, and connects the RF circuit board 40 electrically to the main circuit board 30.

The main circuit board 30 is a printed circuit board comprising signal layers 31, 33, 34 and 36, a power plane 32 and a conductive layer 35, i.e., six layers in total (FIG. 1B). As shown in FIGS. 1B and 1C, the conductive layer 35 is provided with slits 39. The slits 39 separate the conductive layer 35 into a ground plane 75 and a power belt 37 surrounding the ground plane 75. A plurality of vias 38 connect the power belt 37 with the power plane 32 so that the power belt 37 has the same potential as the power plane 32 with respect to high frequency.

The RF circuit board 40 is mounted with the antenna 41 on its surface opposite to the surface facing to the main circuit board 30. The RF circuit board 40 is connected to a surface of the main circuit board 30 through the connector 27. The surface is on the opposite side to the conductive layer 35 having the slits 39 (i.e., the layer arranged with the pair of the power belt 37 and the ground plane 75), with reference to the power plane 32. And, the RF circuit board 40 is electrically connected to the main circuit board 30 through the connector 27.

Next, will be described the principle of electric field suppression by the printed circuit board of the present embodiment.

Figures 2, 3:
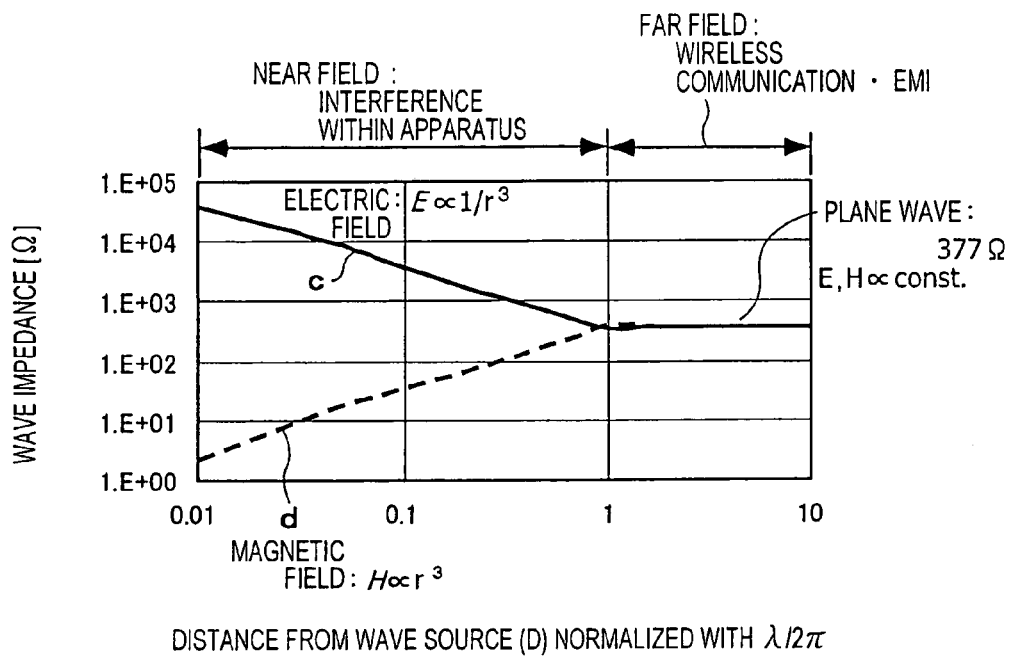
FIG. 2 is a diagram showing a relation between a wave impedance of an electromagnetic wave and distance from a wave source.
FIG. 3 is a diagram showing an interference relation between a type of radio antenna and a noise source.

First, referring to FIG. 2, will be generally described noise interference between a radio antenna and a digital circuit inside a chassis, and conditions that cause the interference.

FIG. 2 is a diagram showing a relation between a wave impedance of an electromagnetic wave (H: magnetic field type, E: electric field type) and a distance D from a wave source. The horizontal axis indicates distance from a noise source (a wave source) being normalized with a wave length λ, and the vertical axis indicates wave impedance (in Ω).

In the example shown in FIG. 2, when the noise source is a magnetic field type (the solid line d), then, in the very close neighborhood of the wave source (the normalized distance from the wave source=0.01), an magnetic field type wave impedance (H) is 1.E+00<H<1.E+01, and H increases in proportion to the third power of the distance r, until the normalized distance from the wave source becomes nearly 1. When the distance is more than 1, the value of the magnetic field type wave impedance (H) becomes almost constant at 377 Ω.

Further, when the noise source is an electric field type (the dotted line c), then, in the very close neighborhood of the wave source (the normalized distance from the wave source= 0.01), an electric field type wave impedance (E) is 1.E+04<E<1.E+05, and H increases in inverse proportion to the third power of the distance r, until the normalized distance becomes nearly 1. When the distance is more than 1, the value of the electric field type wave impedance (E) becomes almost constant at 377 Ω.

In the case of the interference inside a chassis, a noise radiation pattern differs whether a noise source is an electric field type or a magnetic field type, because of the above-described characteristics of the impedances E and H. In the case of frequencies of 0.8 to 5.5 GHz used in a cellular phone or a wireless LAN, the normalized distance 1 becomes about 50 mm at most. Sizes of chassis of notebook-sized computers and cellular phones belong to this category. Accordingly, when electromagnetic noise inside a chassis of a notebook-sized computer or a cellular phone is to be considered, the main noise is an electric field noise.

Next, referring to FIG. 3, will be described a relation between a type of radio antenna as an object of interference and a type of noise source.

As a radio antenna, may be mentioned a magnetic field type antenna such as a loop antenna and an electric field type antenna such as an F antenna, a helical antenna and a patch antenna. Generally, an electric field type antenna is used as a radio antenna. As a result, a radio antenna is affected strongly when a noise radiation source is an electric field type.

The antenna 41 in the present embodiment is an electric field type antenna. Accordingly, the antenna 41 is affected strongly when a noise radiation source is an electric field type. As an electric field type noise radiation source, may be mentioned, for example, a patch antenna structure formed by a power plane and a ground plane arranged in opposition to each other.

Next, referring to FIGS. 4A and 4B, will be described a principle of suppressing electric field noise that reaches from a printed circuit board of the patch antenna structure to an electric field type antenna.

Figure 4A:
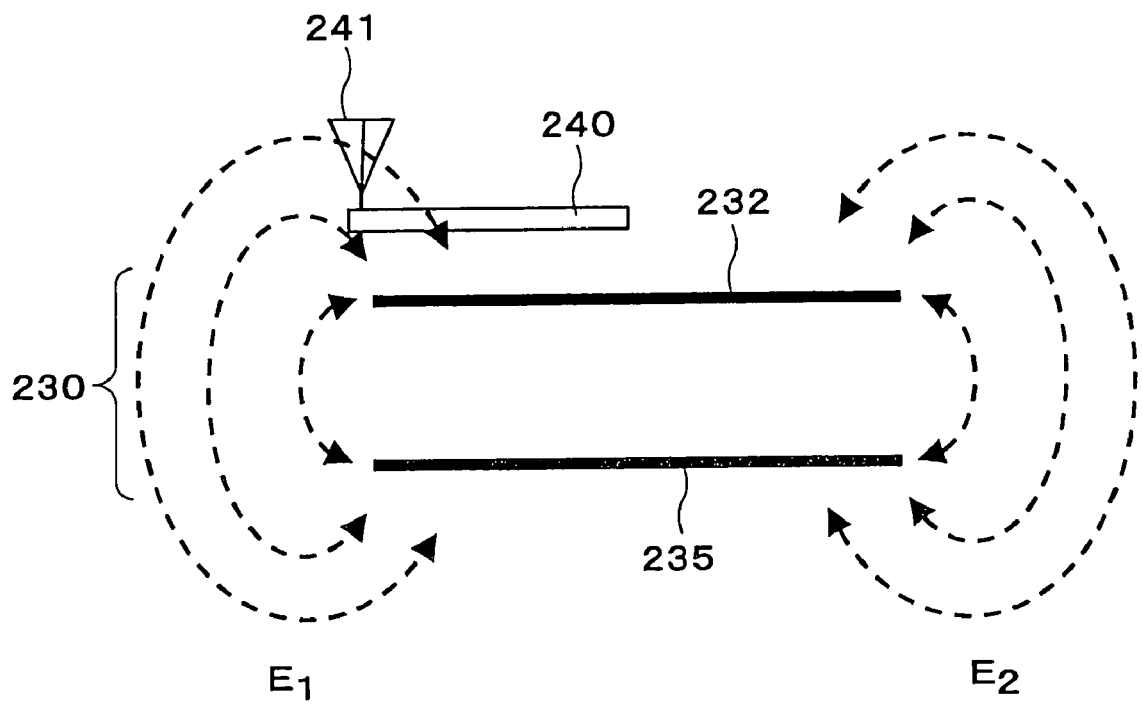
FIGS. 4A and 4B are diagrams explaining generation of an electric field.

FIG. 4A illustrates the effect of electric fields ($E_1$ and $E_2$) on an electric field type antenna. Here, the electric fields $E_1$ and $E_2$ are generated at the resonance frequency of a conventional printed circuit board of the patch antenna structure.

A main circuit board 230 of the conventional printed circuit board having the patch antenna structure comprises a power plane 232 and a ground plane 235 arranged in opposition to each other, and each plane is wired up to its end portion. As shown in FIG. 4A, an RF board mounted with a wireless communication circuit is arranged over and facing to the power plane 232, on the other side of the power plane 232 from the ground plane 235. An antenna 241 is fixed on the RF board 240.

Owing to the potential difference between the power plane 232 and the ground plane 235, voltage amplitudes becomes maximum at the end portions of the planes 232 and 235. As a result, strong electric fields $E_1$ and $E_2$ (shown by the dotted lines and arrows in the figure) are generated at the end portions of the planes 232 and 235, and the electric field $E_1$ is coupled with the antenna 241 and the RF circuit 240 to cause interference (noise) with the antenna 241.

Figure 4B:
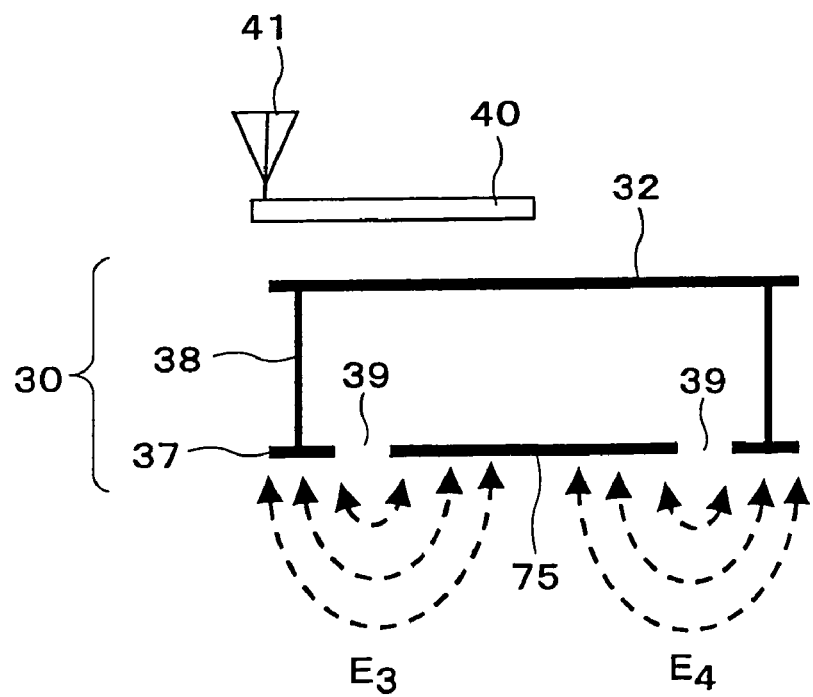

On the other hand, FIG. 4B illustrates the effect of electric fields ($E_3$ and $E_4$) on an electric field type antenna. Here, the electric fields $E_3$ and $E_4$ are generated at the resonance frequency of the printed circuit board of the present embodiment shown in FIGS. 1A to 1C.

In the printed circuit board of the present embodiment, the electric fields $E_3$ and $E_4$ are generated between the power belt 37 and the ground plane 75, namely, at the slits 39. As described above, the slits 39 between the power belt 37 in the end portion of the board and the ground plane 75 are arranged on the back side of the power plane 32, seen from the antenna 41.

Accordingly, coupling of the generated electric fields $E_3$ and $E_4$ with the antenna 41 and the RF circuit 40 is weak, and noise interference with the antenna 41 is suppressed and performance of wireless communication (an error rate and communication distance) can be improved.

Next, effects of the present embodiment will be described.

Figure 5A:
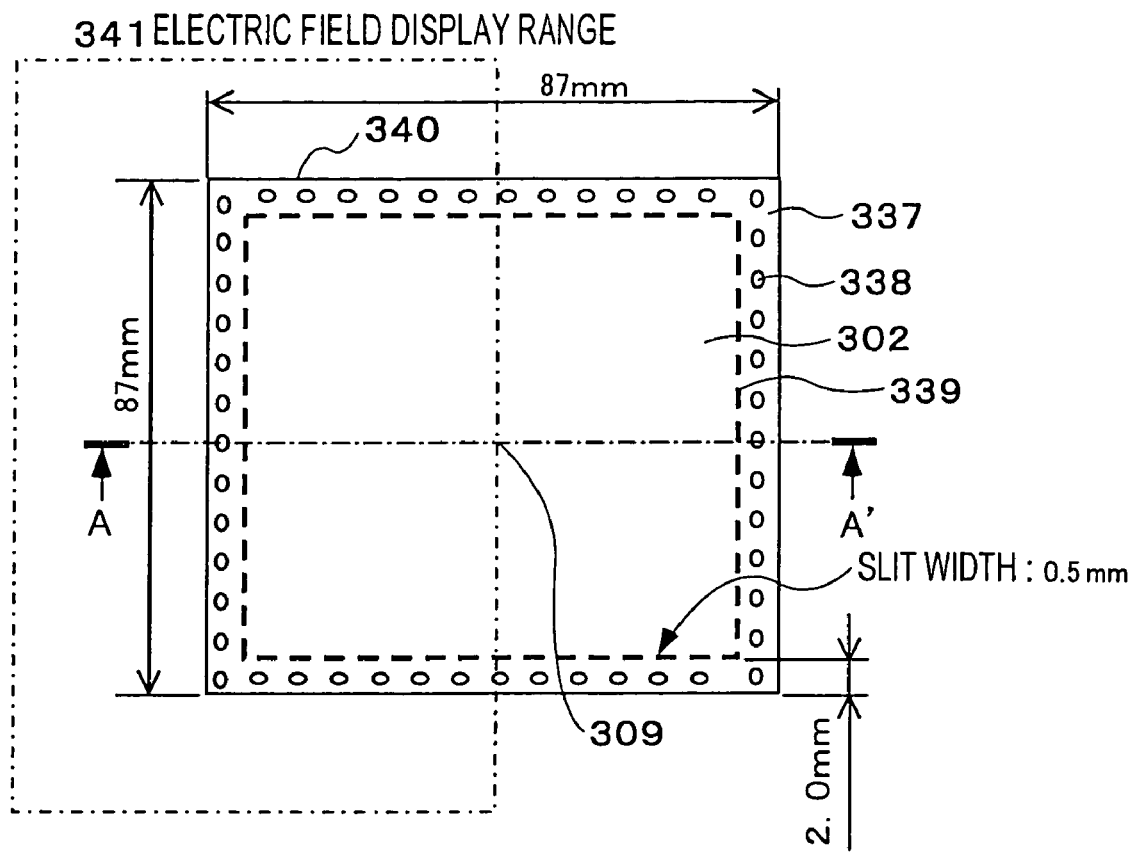
FIGS. 5A and 5B are schematic diagrams showing a board as a measuring object (measuring object board), which is similar to the first embodiment.
Figure 5B:
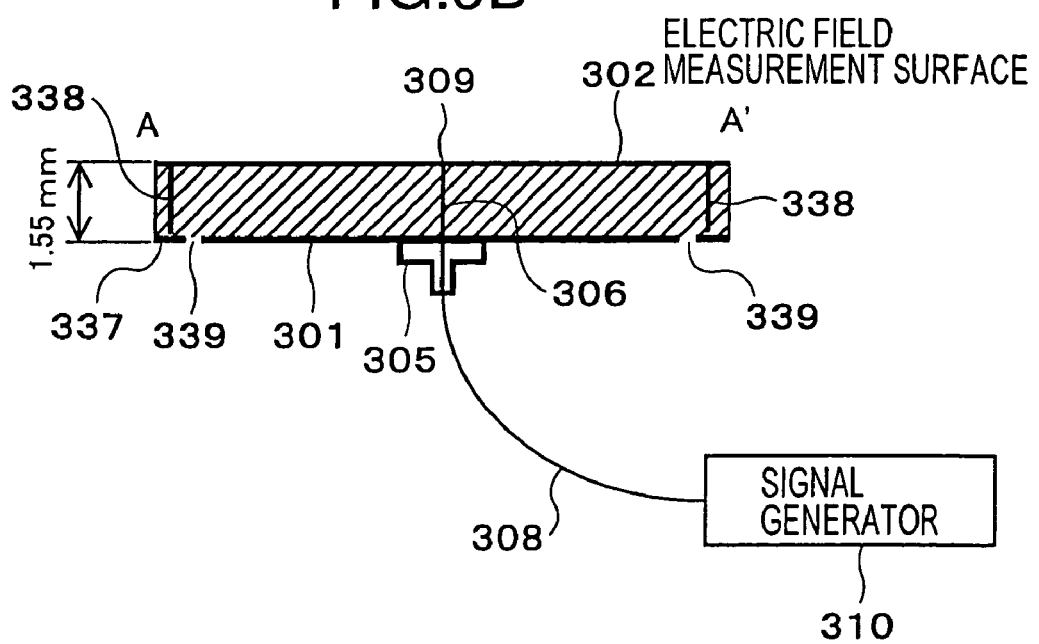

FIG. 5A is a plan view showing a board (board as an object of measuring an electric field) whose structure is similar to the main circuit board 30 constituting the printed circuit board shown in FIG. 4B. FIG. 5B is a cross section taken along the A–A' line of FIG. 5A. In addition, FIGS. 5A and 5B show a board which inspects an effect of the present embodiment. In FIGS. 1A, 1B, 1C, 4A and 4B, the positions of a power plane and a grand plane are replaced. However, the effect dose not change.

In FIGS. 5A and 5B, the board as the measuring object (measuring object board) is a square board, one side of which is 87 mm in length, and the dielectric ratio ∈r of the board is 4.5. A power plane 301 is stuck to one surface of the board, and a ground plane (which is also an electric field measurement surface) 302 is stuck to the other surface. Further, a distance between the power plane 301 and the ground plane 302 (i.e., the thickness of the board) is 1.55 mm.

Similarly to the main circuit board 30 shown in FIG. 1, the measuring object board shown in FIG. 5 is provided with a ground belt 337 on the periphery of the power plane 301, while slits 339 (slit width 0.5 mm) interpose between the ground belt 337 and the power plane 301. The ground belt 337 is electrically connected with the ground plane 302 through vias 338.

In the center of the power plane 301, an SMA connector 305 is fixed. This connector 305 is connected to the ground plane 302 through a signal line 306. The connector 305 is connected to a signal generator 310 through a wire 308. Noise of a 2.4 GHz band generated by the signal generator 310 is put into the ground plane 302 at a point 309 through the wire 308 and the signal line 306. This printed circuit board is designed such that resonance in the TE22 mode occurs in the 2.45 GHz band. Further, an electric field display range 341 is a range (shown in FIG. 8 referred to later) of displaying an electric field measured in the ground plane 30 and its neighborhood.

Figure 6A:
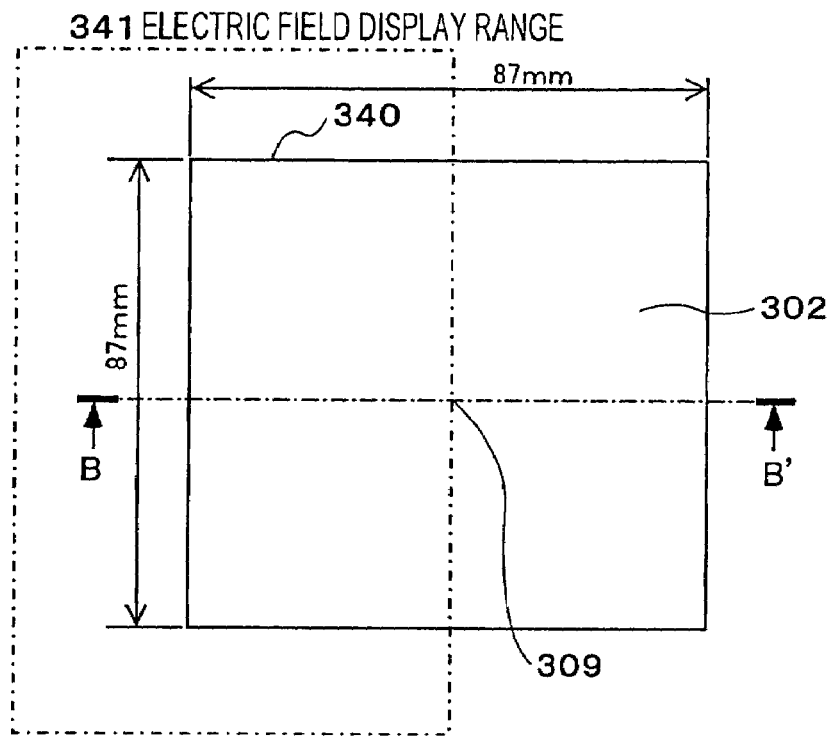
FIGS. 6A and 6B are schematic diagrams showing a measuring object board similar to a conventional board.
Figure 6B:
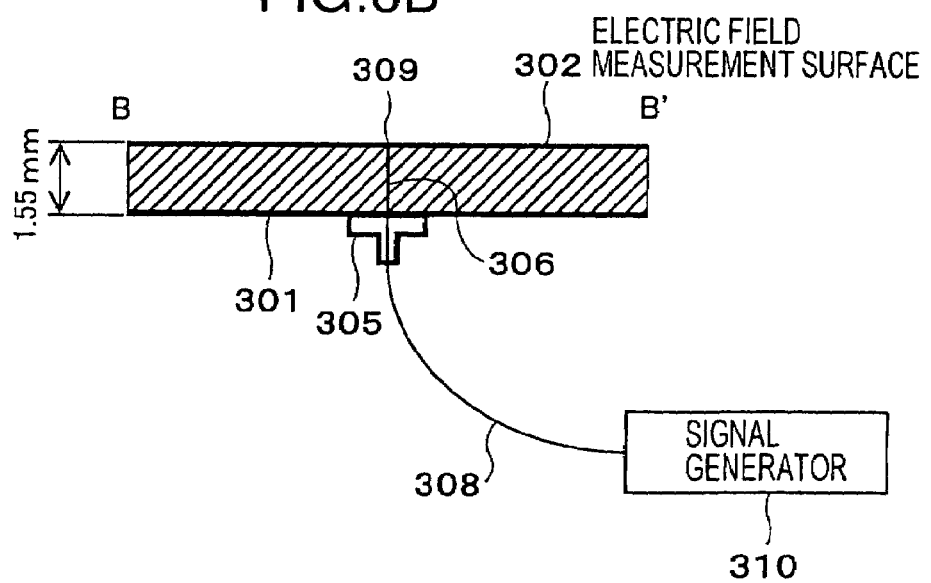

FIG. 6A is a plan view of a board (a board as an object of measuring an electric field) whose structure is similar to the main circuit board 230 constituting the conventional printed circuit board shown in FIG. 4A. FIG. 6B is a cross section taken along the one-dot chain line B–B' of FIG. 6A.

Differently from the measuring object board shown in FIG. 5, the measuring object board shown in FIGS. 6A and 6B do not have a ground belt 337 interposed by slits 339 in the periphery of a power plane 301. Except that, the board is similar to the measuring object board shown in FIGS. 5A and 5B, and like numerals refer to like parts.

Figure 7:
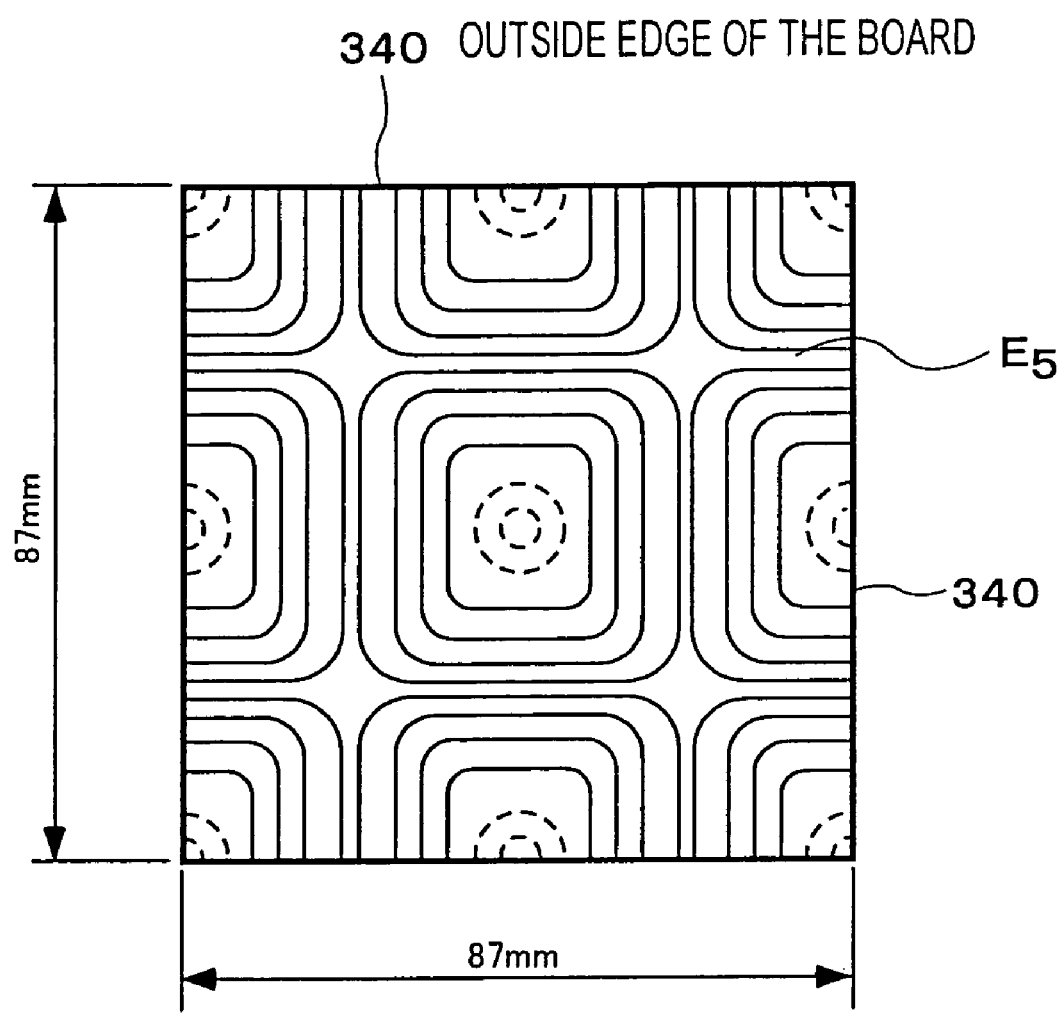
FIG. 7 shows a simulation result of an electric field inside a measuring object board.

FIG. 7 shows a result of simulating a resonance mode of an electric field of the measuring object board shown in FIGS. 6A and 6B. A contour map of an electric field $E_5$ in FIG. 7 shows behavior of generating the electric field $E_5$ in the 2.4 GHz band inside the printed board 300. This map is obtained by calculation assuming a dielectric ratio ∈r 4.5 for a square part that is 87 mm in its side length and located between the ground plane 302 and the power plane 301. This result shows generation of a train of standing waves having peaks of strong electric fields regularly distributed on the surface at the vertexes (i.e., corners) of the measuring object board, the centers of the sides (i.e., outside edges 340 of the board), and the center of the measuring object board.

Next, with respect to the measuring object boards shown in FIGS. 5A, 5B, 6A and 6B, FIGS. 8A to 8C shows the results of the measurement of the electric fields ($E_6$ and $E_7$) in the ground planes 302 and their neighborhood.

FIG. 8A is a contour map showing the measurements of the electric field $E_6$ in the electric field display range 341 for the power plane 302 of the measuring object board (the board having the structure similar to the main circuit board of the present embodiment) shown in FIGS. 5A and 5B. FIG. 8B is a contour map showing the measurements of the electric fields $E_7$ in the electric field display range 341 for the ground plane 302 of the measuring object board (the board having the structure similar to the conventional main circuit board) shown in FIGS. 6A and 6B. FIG. 8C shows hatching patterns for indicating the field strengths in the FIGS. 8A and 8B. Although the line patterns are used in the figures to distinguish the field strengths, color patterns may be used instead of the line patterns.

In FIGS. 8A and 8C, only the left half (the electric field display range 341) of the electric field is shown. Since the ground plane 302 has a symmetrical shape, the electric field of the right half is also symmetrical to that of the left half.

In the case of the electric field $E_7$ of the measuring object board having the structure (FIG. 6) similar to the conventional main circuit board, FIG. 8B shows that the electric field radiates strongly at the vertexes (corners) and the centers of the outside edges 340 of the board of the ground plane 302. The distribution of the electric field $E_7$ is similar to that of the electric field $E_5$ inside the board shown in the simulation result of FIG. 7.

On the other hand, in the case of the electric field $E_6$ of the measuring object board having the structure (FIG. 5) similar to the main circuit board of the present embodiment, FIG. 8A shows the weaker field strengths than the result of FIG. 8B by about 7 to 10 dB.

In the above two cases, the measurements of the electric fields were commonly done on and around the side of the ground plane 302 rather than that of the power plane 301. FIG. 8 illustrates that the electric fields on the ground plane side in the construction in FIG. 5 (with the slits 339) are weaker than that in the construction in FIG. 6 (without slits). Thus, setting the RF circuit board 40 with the antenna 41 over the ground plane 302 (as the relation between the the circuit board 40 and the power plane 32 in FIG. 4 B) allows to suppress the effects of the electric field on the circuit board 40 and the antenna 41.

As described above, in the present embodiment, the power belt 37 connected to the power plane 32 is provided in the periphery of the ground plane 75, while the slits 39 interpose between the power belt 37 and the ground plane 75. The slits 39 from which the electric fields radiate are located on the opposite side to that mounted on the antenna 41, with reference to the power plane 32. This construction, then, enables to emit the electric field noises in wireless communication on the ground-plane side on which the antenna 41 is not mounted. Thereby, interference of electric field noise with the antenna 41 and the RF circuit 40 can be suppressed. In the present embodiment, the slits 39 between the power belt 37 and the ground plane 75 form the structure for causing an electric field. However, it is possible to exchange the ground potential with the power supply potential. In other words, in FIG. 1, a ground belt 37 may be provided in the periphery of a power plane 75, while slits 39 interpose between the ground belt 37 and the power plane 75. The ground belt 37 is connected to a ground plane 32, and an antenna 41 is arranged on the opposite side to the power plane 35, with reference to the ground plane 32. In other words, in FIG. 1, the numerals 32 and 37 refer to the ground, and the numeral 75 refers to the power supply potential.

Next, a second embodiment of the present invention will be described.

Figure 9A:
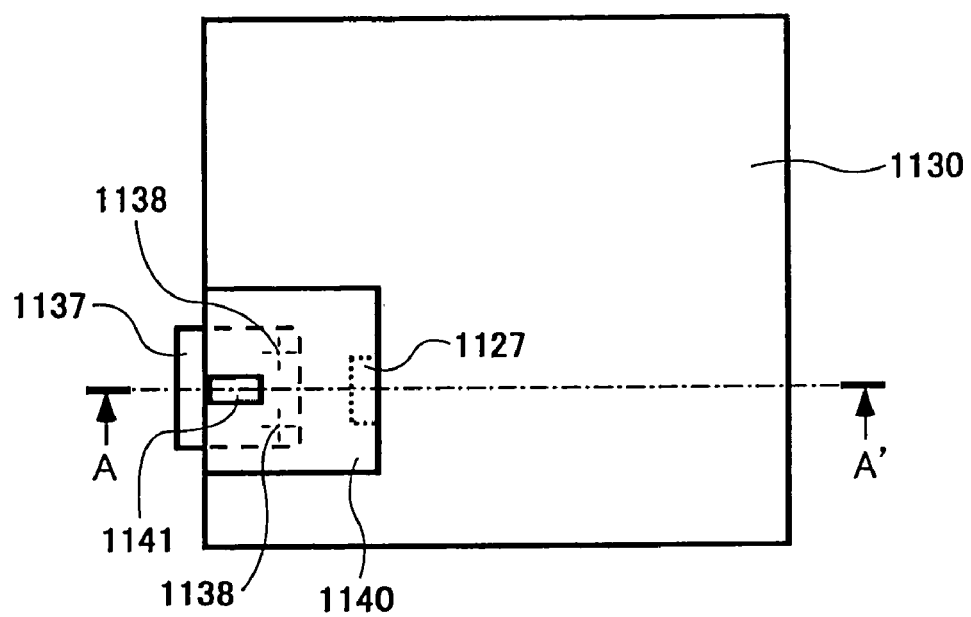
FIGS. 9A and 9B are schematic diagrams showing a printed circuit board according to a second embodiment of the present invention.
Figure 9B:
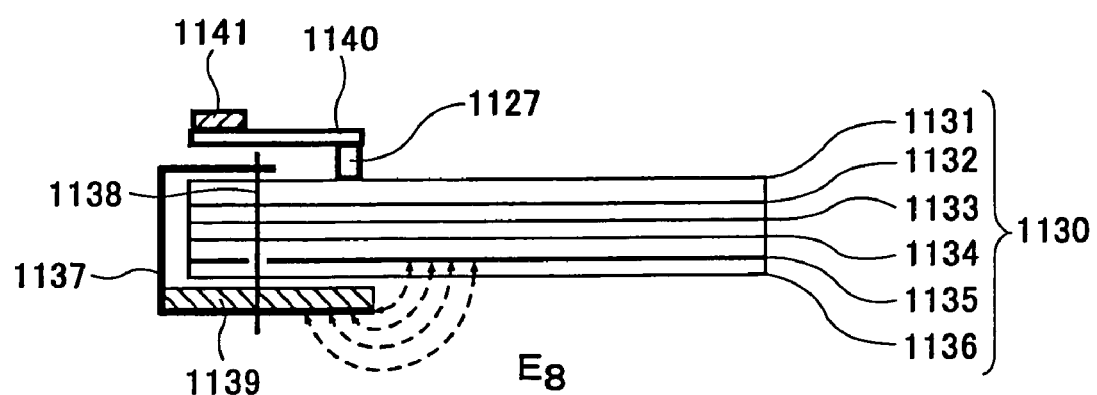

FIGS. 9A and 9B are schematic diagrams showing a printed circuit board to which the second embodiment of the present invention is applied. FIG. 9A is a plan view, and FIG. 9B is a cross section taken along the A–A' line of FIG. 9A.

As shown in the figure, the printed circuit board of the present embodiment comprises a main circuit board 1130 mounted with digital circuits, an RF circuit board 1140 mounted with a wireless communication circuit, an antenna 1141, a connector 1127, a U-shaped metal part 1137, and setscrews 1138.

A main circuit board 1130 is a printed circuit board comprising signal layers 1131, 1133, 1134 and 1136, a ground plane 1132 and a power plane 1135, i.e., six layers in total. The RF circuit board 1140 is mounted with an antenna 1141, and electrically connected to the main circuit board 1130 through the connector 1127.

As shown in the figure, the U-shaped metal part 1137 is fixed just below the antenna 1141 such that the U-shaped metal part 1137 partly encloses the main circuit board 1130.

An insulating sheet 1139 is attached to this U-shaped metal part 1137, at the side nearest to the conductive layer 1136.

The setscrews 1138 are used to fix the U-shaped metal part 1137 such that the U-shaped metal part 1137 partly encloses the main circuit board 1130. To that end, the setscrews 1138 penetrate the U-shaped metal part 1137 and the main circuit board 1130. The setscrews 1138 are electrically connected to the U-shaped metal part 1137 and the ground plane 1132. On the other hand, the setscrews 1138 are not electrically connected to the power plane 1135, and pass through a hole portion opened in the power plane 1135. Further, the setscrews 1138 penetrate the insulating sheet 1139 to reach the U-shaped metal part 1137 again.

According to the thus-described construction, the U-shaped metal part 1137 has the same ground potential as the ground plane 1132. As a result, as shown in FIG. 9B, an electric field $E_8$ is generated between the base of the U shape of the U-shaped metal part 1137 and the power plane 1135, and thus the base of the U-shaped metal part 1137 and the power plane 1135 are coupled in their capacities.

According to the present embodiment in FIG. 9, the antenna 1141 on the RF circuit board 1140 is arranged on the side of the ground plane 1132 that has the same potential as the U-shaped metal part 1134. In other words, the antenna 1141 is arranged over the surface opposite to the surface where the electric field $E_8$ is generated. As a result, similar to the first embodiment, coupling between the electric field $E_8$ and the antenna 1141 can be suppressed, noise interference can be reduced, and performance of wireless communication (an error rate and communication distance) can be improved.

Next, a third embodiment of the present invention will be described.

Figure 10A:
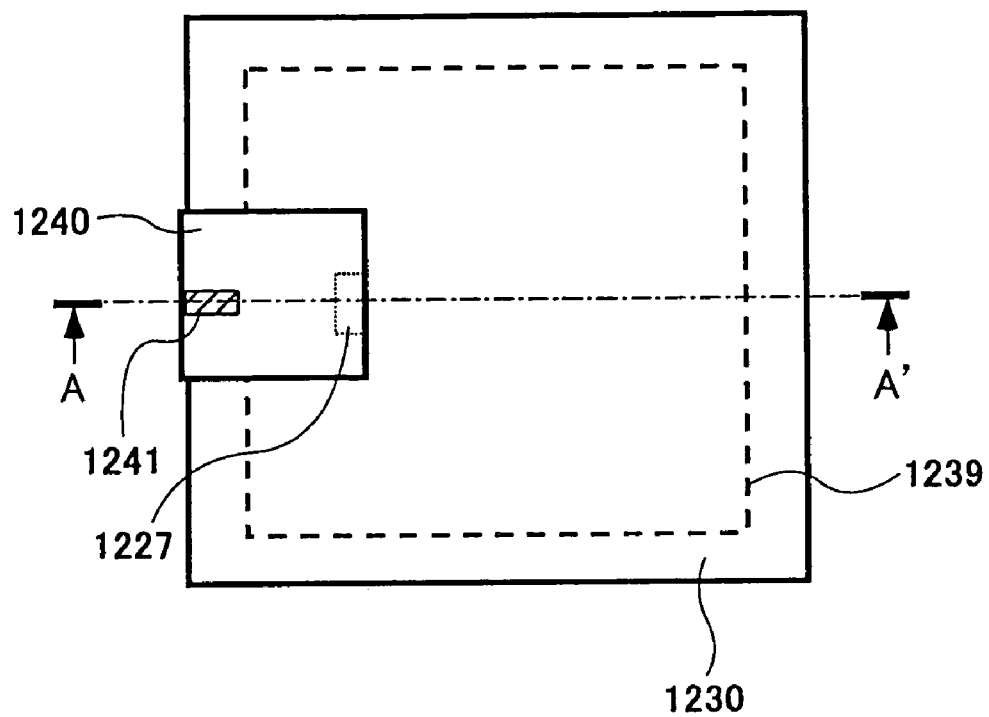
FIGS. 10A and 10B are schematic diagrams showing a printed circuit board according to a third embodiment of the present invention.
Figure 10B:
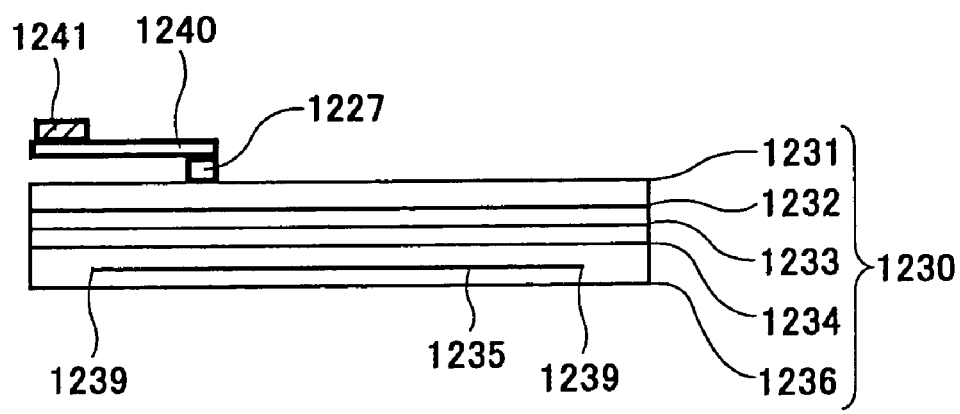

FIGS. 10A and 10B are schematic diagrams showing a printed circuit board to which a third embodiment of the present invention is applied. FIG. 10A is a plan view of the printed circuit board, and FIG. 10B is a cross section taken along the A–A' line of FIG. 10(A).

As shown in the figure, the printed circuit board of the present embodiment comprises a main circuit board 1230 mounted with digital circuits, an RF circuit board 1240 mounted with a wireless communication circuit, an antenna 1241 and a connector 1227. The main circuit board 1230 is a printed circuit board comprising signal layers 1231, 1233, 1234 and 1236, a ground plane 1232 and a power plane 1235, i.e., six layers in total.

The RF circuit board 1240 is mounted with the antenna 1241, and connected electrically to the main circuit board 1230 through the connector 1227. The power plane 1235 is of a size contained within an area of the ground plane 1232, seen from the top surface of the printed circuit board. Namely, four sides of the power plane 1235 are smaller than the ones of the ground plane 1232. In FIG. 10A, a dotted line 1239 shows the outside edges of the power plane 1235.

Figure 11:
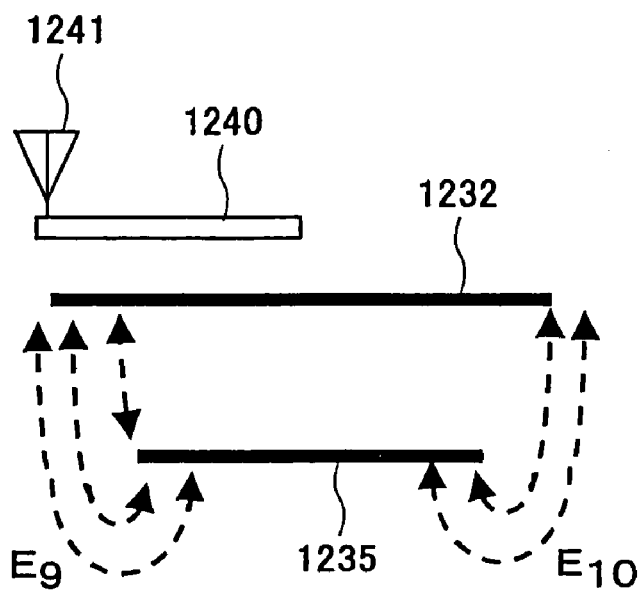
FIG. 11 is a diagram explaining generation of electric fields in the third embodiment of the present invention.

FIG. 11 illustrates the effect of electric fields $E_9$ and $E_{10}$ generated in the printed circuit board of FIGS. 10A and 10B, on an electric field type antenna. The electric fields $E_9$ and $E_{10}$ are generated at the resonance frequency of the printed circuit board of the present embodiment shown in FIGS. 10A and 10B. As the present embodiment shown in FIG. 10, the projection of the power plane 1235 onto the ground plane 1232 is larger than the area of the ground plane 1232. The electric fields $E_9$ and $E_{10}$, then, occur between the end portions of the power plane 1235 and those of the ground plane 1232. Those electric fields $E_9$ and $E_{10}$ can be distributed in the opposite side to that mounted with the antenna 1241, with reference to the ground plane 1232. Accordingly, the electric field noises from the electric fields $E_9$ and $E_{10}$ that interferes with the antenna 1241 can be reduced.

Next, a fourth embodiment of the present invention will be described.

Figure 12:
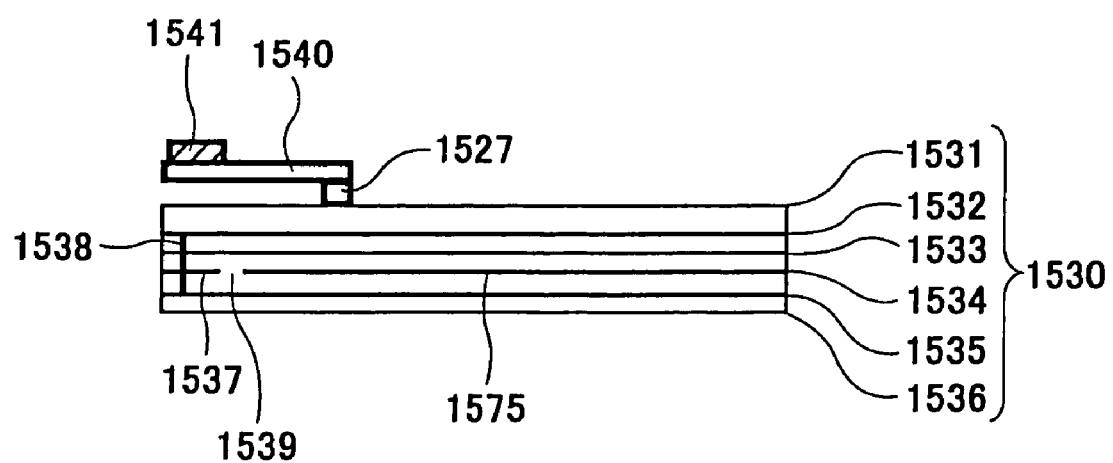
FIG. 12 is a schematic diagram showing a printed circuit board according to a fourth embodiment of the present invention.

FIG. 12 shows a schematic cross section of a printed circuit board to which the fourth embodiment of the present invention is applied.

As shown in FIG. 12, the printed circuit board of the present embodiment comprises a main circuit board 1530 mounted with digital circuits, an RF circuit board 1540 mounted with a wireless communication circuit, an antenna 1541 and a connector 1527.

The main circuit board 1530 comprises signal layers 1531, 1533 and 1536, ground planes 1532 and 1535 and a conductive layer 1534, i.e., six layers in total.

The conductive layer 1534 is provided with slits 1539. The slits 1539 separate the conductive layer 1534 into a power plane 1575 and a ground belt 1537 at the end portion of the board. A plurality of vias 1538 connect the ground belt 1537 with the ground planes 1532 and 1535 so that the ground belt 1537 has the same potential as the ground plane 1535 with respect to high frequency.

One side of the RF circuit board 1540 is mounted with the antenna 1541. The other side of the RF circuit board 1540 connected electrically to a surface 1531 of the main circuit board 1530 through the connector 1527.

According to the present embodiment shown in FIG. 12, the power plane 1575 is located between the two ground planes 1532 and 1535. The ground belt 1537 is located on the same conductive layer 1534 as the power plane 1575 lies on, while the slits 1539 interpose between the ground belt 1537 and the power plane 1575. Therefore, the slits 1539, that is to say, the sources of the electric field noise, are contained inside of the main board 1530 by the two ground planes 1532 and 1535. In addition, the ground belt 1537 is a member of the closed end of the main circuit board 1530, which end is shielded by ground with vias 1538. And the closed end of the main circuit board 1530 is closer to the RF circuit board 1540 with the antenna 1541 than the open end of the board 1530. As a result, the electric field generated at the closed end portion of the main circuit board 1530 can be suppressed to a lower level, and electric field noise to the antenna 1541 can be reduced. Moreover, the electric field noise to the antenna 1541 from the open end of the main circuit board is smaller due to the longer distance between the antenna 1541 and the open end.

Here, the electric field is generated between the power plane 1575 and the ground belt 1537 (which are adjacent to each other with the slits 1539 interposing therebetween) and in the neighborhood. This electric field is enclosed by the ground planes 1532 and 1535 and the plurality of vias 1538 having the ground potential, and accordingly, the effect of this electric field on the antenna 1541 is suppressed.

Next, a fifth embodiment of the present invention will be described.

Figure 13:
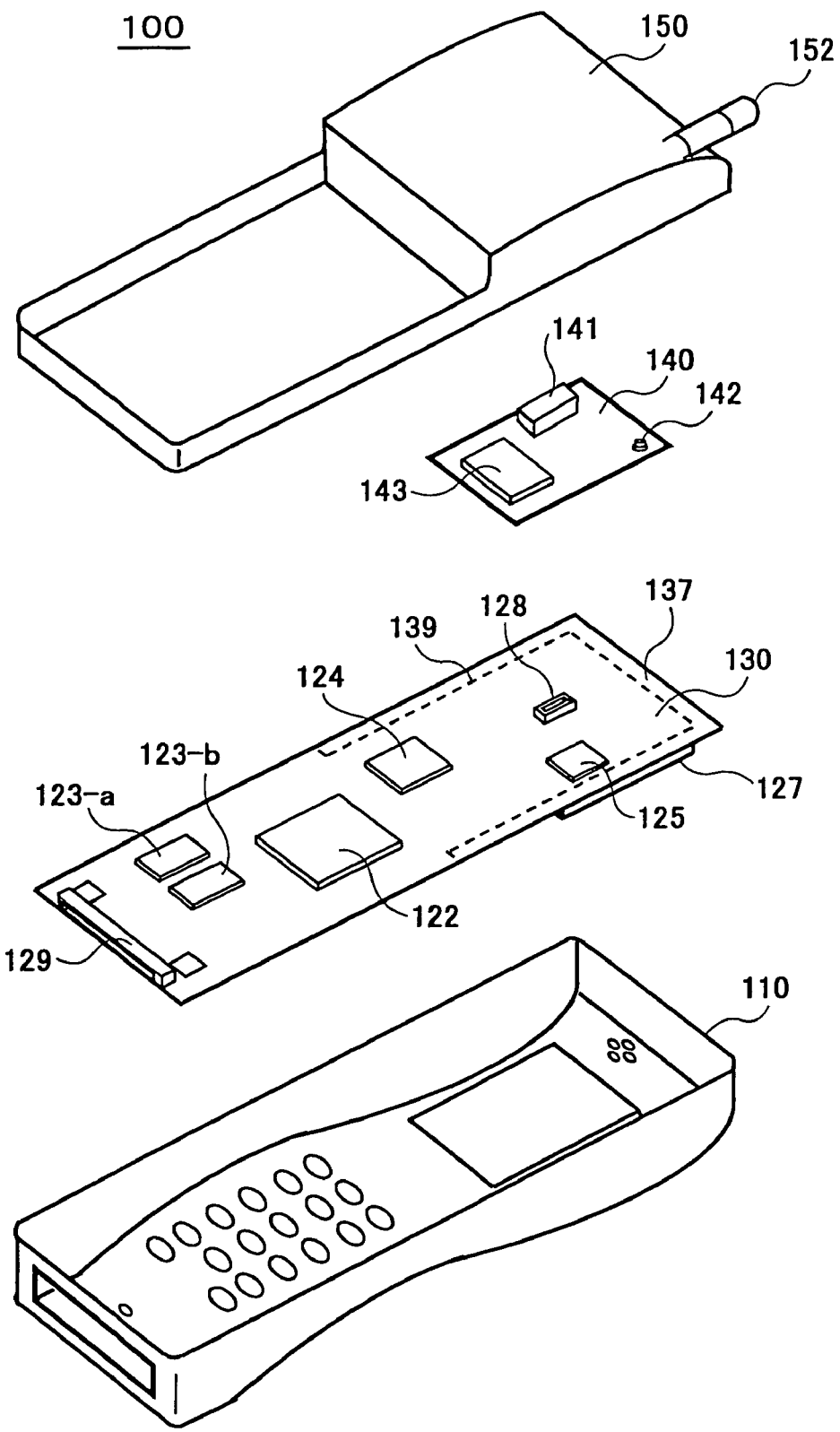
FIG. 13 is an exploded view of a cellular phone according to a fifth embodiment of the present invention.

FIG. 13 is an exploded view showing schematic construction of a cellular phone mounted with a printed circuit board to which the fifth embodiment of the present invention is applied.

As shown in the figure, the cellular phone 100 of the present embodiment comprises a back cmore than 150, an RF circuit board 140 for wireless communication, a main circuit board 130 and a front cmore than 110.

The main circuit board 130 is mounted with digital circuits that include a CPU 122, memories 123-$a$ and 123-$b$, a baseband chip 124, a liquid crystal controller 125, a liquid crystal panel 127, a connector 128, an external connector/charging terminal 129, and the like. On the back side (i.e., a surface on which the liquid crystal panel 127 is located) of the main circuit board 130, the slits 139 are provided.

Further, the RF circuit board 140 for wireless communication is mounted with a chip antenna 141, a rod antenna connector 142, and an RF module 143. This RF circuit board 140 is electrically connected to the main circuit board 130 through the connector 128.

The back cmore than 150 is fixed with a rod antenna 152. This rod antenna 152 is connected to the RF circuit board 140 through the rod antenna connector 142.

This cellular phone 100 is mounted with two antennas, i.e., the chip antenna 141 and the rod antenna 152. The chip antenna 141 functions as a main antenna, and the rod antenna 152 as an auxiliary antenna.

Figure 14A:
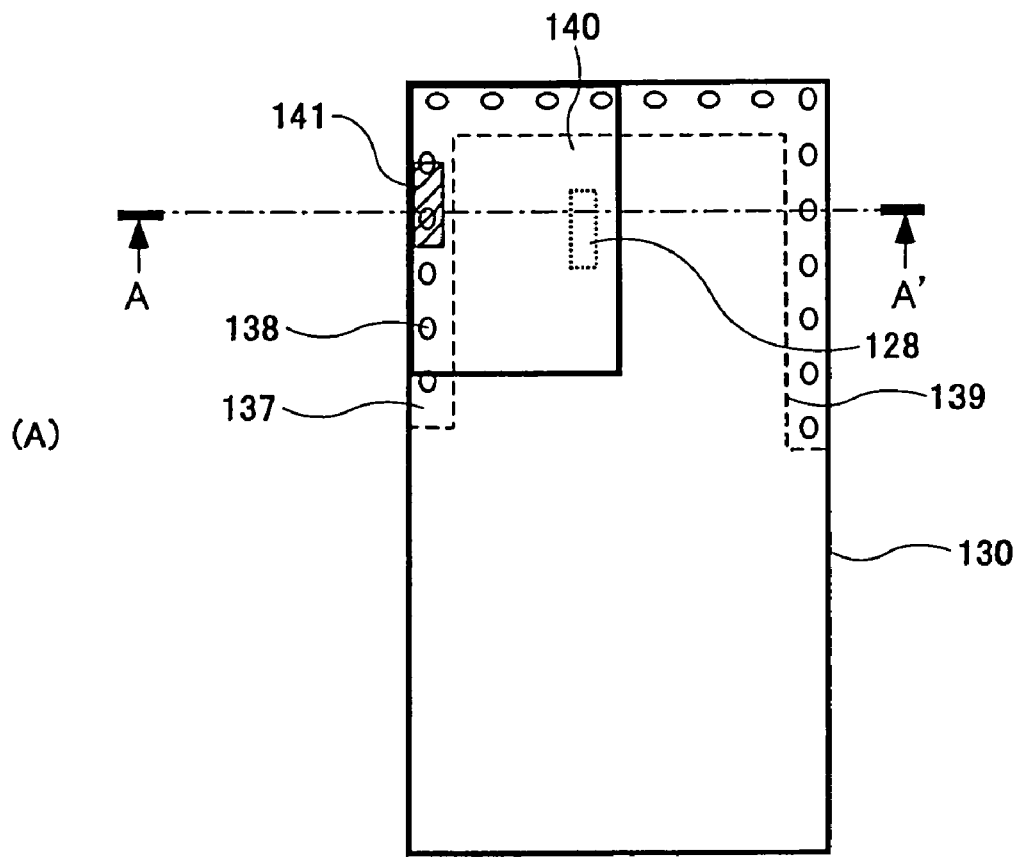
FIGS. 14A and 14B are schematic diagrams showing a printed circuit board according to the fifth embodiment of the present invention.
Figure 14B:
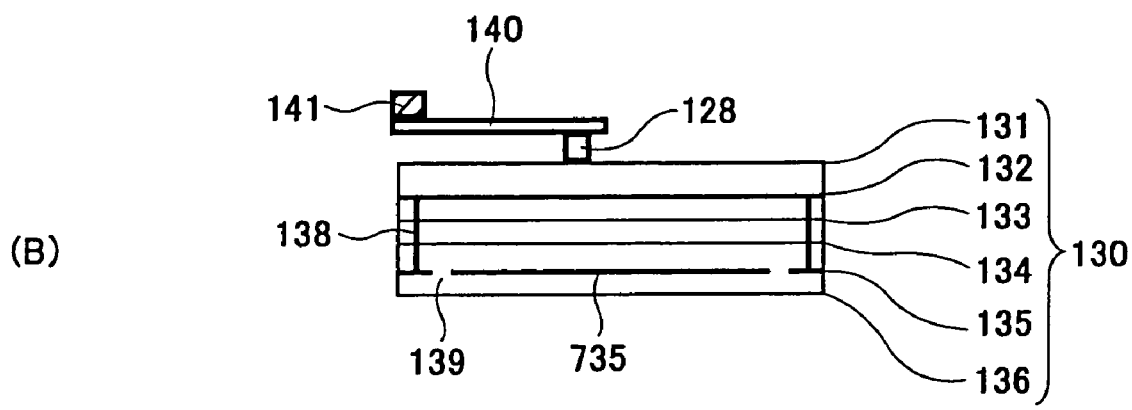

FIGS. 14A and 14B are schematic diagrams showing the main circuit board attached with the RF circuit board 140. FIG. 14A is a plan view showing the main circuit board 130 attached with the RF circuit board 140, and FIG. 14B is a cross section taken along the one-dot chain line A–A' of the FIG. 14A.

The main circuit board 130 is a printed circuit board comprising signal layers 131, 133, 134 and 136, a ground plane 132, and a conductive layer 135, i.e., six layers in total. The conductive layer 135 is provided with slits 139. The slits 139 separate the conductive layer 135 into a power plane 735 and a ground belt 137. In the present embodiment, a part (i.e., an upper half in FIG. 14A) of the power plane 735 is enclosed by the ground belt 137 with the slits interposing between that part and the ground belt 137. The ground belt 137 is connected to the ground plane 132 through a plurality of vias 138 so that the ground belt 137 has the same potential as the ground plane 132 with respect to high frequency. The power plane 735 is connected to the power supply potential. The RF circuit board 140 is electrically connected to the main circuit board 130 through the connector 128 provided on the surface on the opposite side to the conductive layer 135, with reference to the ground plane 132. Further, the RF circuit board 140 is located on the side (i.e., the upper half in FIG. 14A) where the slits 139 are provided, and the antenna 141 is located on the RF circuit board 140. Thus, the slits 139 between the ground belt 137 and the power plane 735 are located on the opposite side to the the antenna 141 on the RF circuit board 140 with reference to the ground plane 132.

According to the present embodiment, similarly to the above-described first embodiment, an electric field is generated in the neighborhood of the slits 139 between the ground belt 137 and the power plane 735. As a result, in the neighborhood of the antenna 141 and the rod antenna 152, effect of the electric field can be suppressed.

In the present embodiment, as the main circuit board mounted, may be used one of the main circuit boards shown in the above-described first through fourth embodiments.

Next, a sixth embodiment of the present invention will be described.

Figure 15:
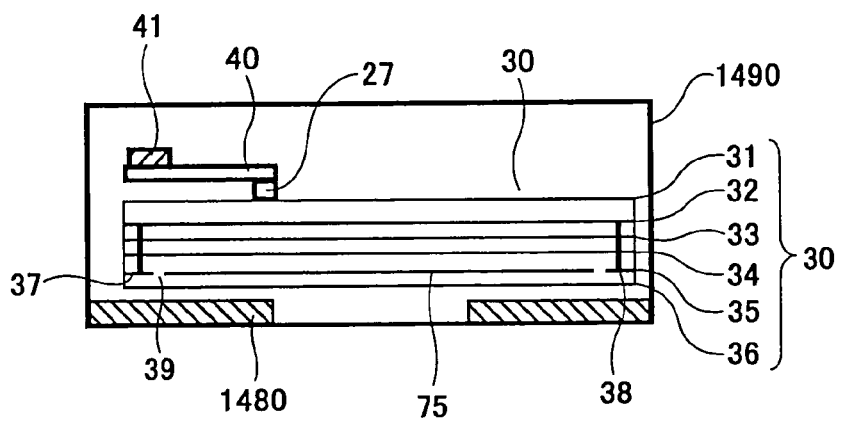
FIG. 15 is a schematic diagram showing a printed circuit board and a chassis according to a sixth embodiment of the present invention.
Figure 16:
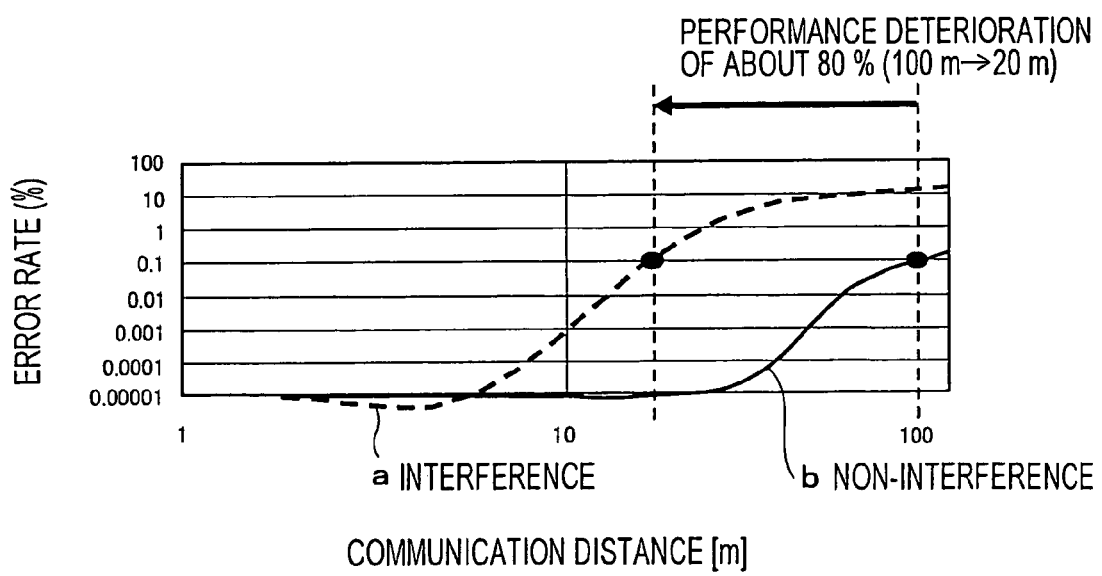
FIG. 16 is a graphic representation of a relation of a communication distance and an error rate.

FIG. 15 is a schematic diagram showing a wireless communication apparatus to which a sixth embodiment of the present invention is applied. As shown in the figure, the wireless communication apparatus of the present embodiment is obtained by mounting the printed circuit board shown in FIG. 1 into a chassis 1490. A radio wave absorption belt 1480 is attached to the chassis 1490 at a part under the slits 39 provided in the main circuit board 30.

According to the present embodiment, similarly to the above-described first embodiment, interference of electric field noise with the wireless communication antenna 41 can be suppressed. Further, in the present embodiment, a part of the electric field is absorbed by the radio wave absorption belt 1480 attached to the chassis 1490. Accordingly, it is possible to prevent reflection of electric field noise in the chassis 1490 and stray noise owing to coupling with the chassis 1490.

In the present embodiment, as the main circuit board mounted, may be used one of the main circuit boards shown in the above-described second through fifth embodiments.

Hereinabove, the embodiments of the present invention have been described.

The above-described embodiments, except for the second embodiment, employ the construction in which shapes or locations of the ground plane and the power plane are changed. The second embodiment employs the construction in which the U-shaped metal part is attached to the printed circuit board. According to such construction, the location of the electric field noise source between the ground plane and the power plane is moved to a location far from the antenna. Thus, in each of the embodiments, noise to the antenna can be reduced without changing a positional relation between the antenna and the printed circuit board including the ground plane and the power plane.

As a result, it is not necessary to keep a large distance between a wireless circuit board and a CPU as a source of electromagnetic noise. It is possible to provide a smaller-sized printed circuit board mounted with a wireless circuit, and a smaller-sized portable information processing apparatus provided with that printed circuit board.

The present invention is not limited to the above-described embodiments, and can be changed variously within the scope of the invention. For example, in the second embodiment shown in FIG. 9, an additional U-shaped metal part 1137 may be attached to the open end of the printed circuit board 1130 on the opposite side to the already-provided U-shaped metal part 1137. The newly-attached U-shaped metal part 1137 can further reduce the electric field noise from the printed circuit board 1130 to the antenna 1141.

In the sixth embodiment shown in FIG. 15, it is possible to employ construction in which the RF board 40 and the antenna 41 are located outside the chassis 1490 while maintaining the electric connection with the printed circuit board 30 through the connector 27. According to this construction, the electric field noise from the printed circuit board 30 to the antenna 41 can be reduced further.

As described above, the present invention can provide a printed circuit board with reduced effect of noise, without having a large distance between a noise source and a board having a wireless communication function. When the above-described printed circuit board is applied to an information processing apparatus having a wireless communication function, it is possible to provide a small-sized information processing apparatus having improved throughput of wireless communication and increased communication distance.

What is claimed is:

1. A printed circuit board mounted with a wireless communication board, comprising:
    multilayer structural conductive layers including a first conductive plane connected to power supply potential and a second conductive plane connected to ground potential;
    wherein:
    said first and second conductive planes are formed such that an electric field generated by a potential difference between the first conductive plane and the second conductive plane is concentrated on one side of one of the first conductive plane and the second conductive plane, and
    the conductive plane associated with the concentrated electric field and the wireless communication board are on different sides relative to the other one of the first conductive plane and the second conductive plane that is not associated with the concentrated electric field.

2. The printed circuit board according to claim 1, wherein:
    said printed circuit board comprises a conductive belt that is formed in a conductive layer in which the conductive plane associated with the concentrated electric field is disposed, and adjacent to said the conductive plane associated with the concentrated field with slits interposing between said conductive belt and the conductive plane with associated concentrated electric field; and
    said conductive belt is electrically connected to the conductive plane not associated with the concentrated electric field.

3. The printed circuit board according to claim 1, wherein:
    said printed circuit board further comprises a U-shaped conductive member that encloses a part of said printed circuit board to cover the surface of said printed circuit board in an area over which said wireless communication board is mounted, and
    said conductive member is electrically connected to the conductive layer not associated with the concentrated electric field.

4. The printed circuit board according to claim 1, wherein the conductive plane associated with the concentrated electric field has a smaller size than said conductive plane not associated with the concentrated electric field, and located within an area of the conductive plane not associated with the concentrated electric field.

5. The printed circuit board according to claim 1, wherein said printed circuit board comprises:
    a conductive belt that is formed in a conductive layer in which the conductive plane associated with the concentrated electric field lies, and located adjacently to the conductive plane associated with the concentrated electric field with slits interposing between said conductive belt and the conductive plane associated with the concentrated electric field;
    a third conductive plane formed in a conductive layer that is located on an opposite side to the conductive plane not associated with the concentrated electric field with respect to the conductive plane associated with the concentrated electric field; and
    said conductive belt and said third conductive plane are electrically connected to the conductive plane not associated with the concentrated electric field.

6. A wireless communication apparatus comprising:
    a printed circuit board according to claim 1; and
    a chassis that houses said printed circuit board.

7. The wireless communication apparatus according to claim 6, further comprising:
    a radio wave absorption member that is located inside said chassis, and absorbs an electric field generated by a potential difference between said power supply potential and said ground potential.

* * * * *